(12) United States Patent
Mun et al.

(10) Patent No.: US 6,541,319 B2
(45) Date of Patent: Apr. 1, 2003

(54) METHOD OF MANUFACTURING A SELF-ALIGNED GATE TRANSISTOR WITH P-TYPE IMPURITIES SELECTIVELY IMPLANTED BELOW THE GATE, SOURCE AND DRAIN ELECTRODES

(75) Inventors: Jae Kyoung Mun, Daejon-Shi (KR); Hea Cheon Kim, Daejon-Shi (KR); Jong Won Lim, Seoul-Shi (KR)

(73) Assignee: Electronics & Telecommunications Research Institute (KR)

( * ) Notice: Subject to any disclaimer, the term of this patent is extended or adjusted under 35 U.S.C. 154(b) by 0 days.

(21) Appl. No.: 10/032,754

(22) Filed: Dec. 26, 2001

(65) Prior Publication Data

US 2002/0081810 A1 Jun. 27, 2002

(30) Foreign Application Priority Data

Dec. 27, 2000 (KR) ........................................ 2000-82810

(51) Int. Cl.$^7$ ............................................. H01L 21/338
(52) U.S. Cl. ....................... 438/174; 438/181; 438/526; 438/533; 438/571; 438/582
(58) Field of Search ................................. 438/174, 181, 438/301, 306, 526, 527, 533, 571, 582, 660

(56) References Cited

U.S. PATENT DOCUMENTS

| | | | |
|---|---|---|---|
| 4,905,061 A | * 2/1990 | Ohmuro et al. | ................ 357/22 |
| 5,041,393 A | * 8/1991 | Ahrens et al. | ................ 437/58 |
| 5,143,857 A | * 9/1992 | Finchem et al. | ............... 437/22 |
| 5,532,507 A | 7/1996 | Wada | |
| 5,698,875 A | * 12/1997 | Varmazis | .................... 257/280 |
| 5,907,177 A | * 5/1999 | Uda et al. | .................... 257/412 |
| 6,083,781 A | 7/2000 | Zolper et al. | |
| 6,316,297 B1 | * 11/2001 | Matsuda | ..................... 438/174 |

FOREIGN PATENT DOCUMENTS

JP 7-235553 9/1995

OTHER PUBLICATIONS

M. Nagaoka, et al., "Refractory Wn/W Self–Aligned Gate GaAs Power metal Semiconductor Field Effect Transistor for 1.9–GHz Digital Mobile Communication System Operating with a single Low–Voltage Power Supply," Jpn. J. Appl. Phys. vol. 33, pp. 767–770, Jan. 1994.

K. Nishihori, "A Self–Aligned Gate GaAs, MESFET with P–Pocket Layers for High–Efficiency Linear Power Amplifiers," IEEE Transactions on Electron Devices, vol. 45, pp. 1385–1392, Jul. 1998.

* cited by examiner

*Primary Examiner*—Carl Whitehead, Jr.
*Assistant Examiner*—Stephen W. Smoot
(74) *Attorney, Agent, or Firm*—Blakely Sokoloff Taylor & Zafman

(57) ABSTRACT

The present invention provides a self-aligned gate transistor. The present invention implants P-type impurity ions only below a channel region below a gate and below a source and drain electrode on semiconductor substrate having an ion implantation channel layer without implanting the P-type impurity ions into a narrow region between the source-gate and the gate-drain, deposits a gate metal and etches the gate pattern. In this case, the length (Lg) of the gate is defined to be narrower than the length (Lch-g) into which P-type impurity ions are implanted below the channel layer, thus improving a pinch-off characteristic. A method of manufacturing a field effect transistor having a self aligned gate according to the present invention comprises the steps of implanting P-type impurity ions only below a channel region below a gate and below a source and drain electrode; and depositing a refractory gate metal having a good high temperature stability to form a gate pattern using a dry etch method.

4 Claims, 4 Drawing Sheets

METHOD OF MANUFACTURING A SELF-ALIGNED GATE TRANSISTOR WITH P-TYPE IMPURITIES SELECTIVELY IMPLANTED BELOW THE GATE, SOURCE AND DRAIN ELECTRODES

BACKGROUND OF THE INVENTION

1. Field of the Invention

The invention relates generally to a method of manufacturing a self-aligned gate transistor, and more particularly to, a method of forming an improved channel structure.

2. Description of the Prior Art

Generally, in order to manufacture a transistor having a good direct current (DC) and radio frequency (RF) characteristic, it is inevitably required that the length of a gate, the depth of a channel, the resistance between a source and a gate, and between a gate and a drain, etc. be reduced, As the length of the gate is reduced, however, a short channel effect is further severe along with increase in the resistance of the gate. An increase in the resistance of the gate degrades a gain or a noise characteristic of the device. In order to prevent this, a gate, a lower side of which is small but an upper side of which is great, so called a gate having a T-type shape was proposed. An increase in the short channel effect causes to lower a breakdown voltage between the source and drain to degrade the power characteristic. In order to prevent this, a method has been used by which a P-type impurity is implanted below a current transfer channel to obviate a trail of a N-type impurity. However, the parasitic capacitance is increased due to implantation of the P-type impurity, which degrades an alternating current (AC) characteristic such as $f_T$ (cut-off frequency) or $f_{max}$ (maximum oscillation frequency) of the device. Therefore, there usually exists a trade-off to design P-type and N-type channels for optimizing DC and RF characteristics.

Of these methods, a method by which P-type impurity ions having different concentration are implanted below the channel layer and below the source and drain for form a channel, has disadvantages that the process is complicated since two step lithography processes are required for P-type ion implantation process having different concentration and irregularity in the shape and characteristic is caused due to mismatching of alignment.

Another method is one so called a pocket type ion implantation method by which P-type impurity ions are not implanted below the channel layer but P-type impurity ions are implanted only below the source and drain. This method, however, has a problem that the resistance between the source and the gate, and between the gate and the drain is increased.

SUMMARY OF THE INVENTION

The present invention is contrived to solve the above problems and an object of the present invention is to provide a method of forming an improved transistor having a channel structure useful in manufacturing a self-aligned transistor having a good DC and RF characteristic.

Also, another object of the present invention is to improve noise and high frequency characteristics by reducing the resistance between a source-gate and a gate-drain while reducing a short channel effect and to increase the power density of a power device by increasing the current density between source and drain.

In order to accomplish the above object, a method of manufacturing a self-aligned gate transistor according to the present invention, is characterized in that it comprise the steps of implanting P-type impurity ions only below a channel region below a gate and below a source and drain electrode; and depositing a refractory gate metal having a good high temperature stability to form a gate pattern using a dry etch method.

Also, preferably, a method of manufacturing a self-aligned gate transistor according to the present invention further comprises a first step of etching the gate pattern including depositing the gate without implanting P-type impurity ions into a narrow region between the source-gate and the gate-drain and depositing; a second step of implanting ions using the gate as a mask to form a LDD (lightly doped drain) layer; a third step of performing N+ type ions on the source/drain region; a fourth step of forming a resistant metal for ohmic contact and performing an annealing process to form an ohmic contact layer; and a fifth step of forming a source/drain electrode for contact to the ohmic contact layer.

According to a preferred embodiment of the present invention, P-type impurity ions are implanted only below the underlying gate channel region and the source and drain electrode and a refractory gate metal having a good high-temperature stability. Then, a gate pattern is formed by a dry etch method. Next, LDD (lightly doped drain) ion implantation and N+ ion implantation are performed in order to reduce the resistance between the source-gate and the gate-drain using the gate pattern. Next, a refractory gate metal having a good high-temperature stability is activated so that a transistor having a self aligned gate having a good DC and RF characteristic and a good high-temperature stability.

BRIEF DESCRIPTION OF THE DRAWINGS

The aforementioned aspects and other features of the present invention will be explained in the following description, taken in conjunction with the accompanying drawings, wherein.

DETAILED DESCRIPTION OF PREFERRED EMBODIMENTS

Figure 1A:
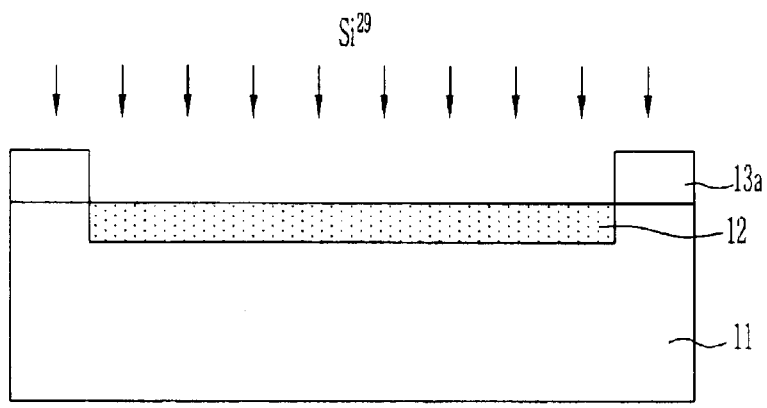
FIG. 1a to FIG. 1h are cross-sectional views of a transistor having a self aligned gate for explaining a method of manufacturing the transistor according to a preferred embodiment of the present invention.
Figure 1B:
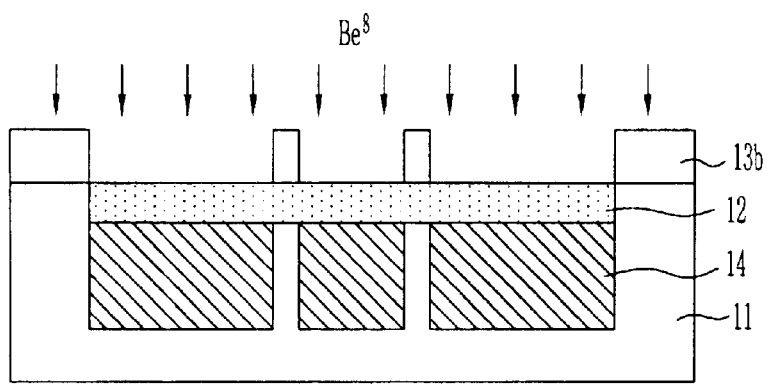

The present invention will be described in detail by way of a preferred embodiment with reference to accompanying drawings, in which like reference numerals are used to identify the same or similar parts.

FIG. 1a to FIG. 1h are cross-sectional views of a transistor having a self aligned gate for explaining a method of manufacturing the transistor according to a preferred embodiment of the present invention.

Referring now to FIG. 1a, a photolithographic film pattern is formed in a portion that will be a channel such as 13a, within a semiconductor substrate 11. Then, silicon dopant ions are implanted to form a channel layer 12. Next, a region for selective P-type impurity implantation is defined where a channel below a gate and source and drain like 13b will be formed. Thereafter, a P-type impurity 14 is ion-implanted.

Figure 1C:
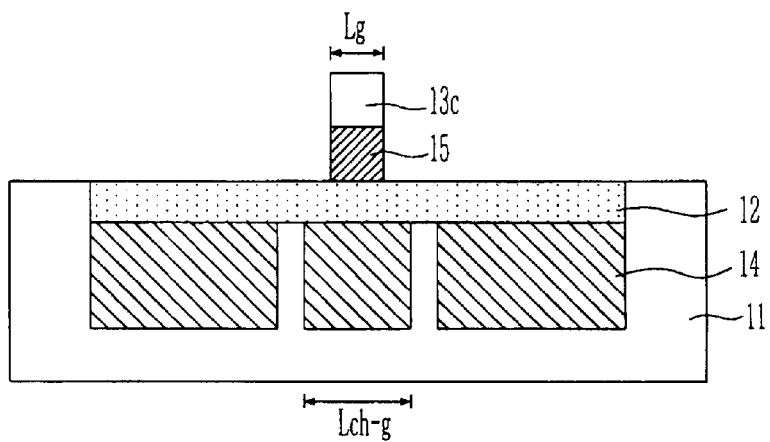

At this time the P-type impurity includes Be, Mg, C, and the like. Then, metal serving as a gate is deposited using a sputtering equipment and the gate is then patterned as shown in FIG. 1c. Next, a gate 15 is formed by a dry etch method. At this time, the length (Lg) of the gate is defined to be narrower than the length (Lch-g) in which P-type impurity ions are implanted below the channel layer in order to improve a pinch-off characteristic.

At this time, the gate metal 15 may be formed of a refractory metal having a good thermal stability. Also, it is preferred that the thin refractory metal film is formed of a single layer made of one of tungsten (W) or tungsten nitride (WNx), tungsten silicide (WSix), or tungsten silynitride (WSiNx) and the like, or a dual layer made of tungsten nitride/tungsten (WNx/W).

Figure 1D:
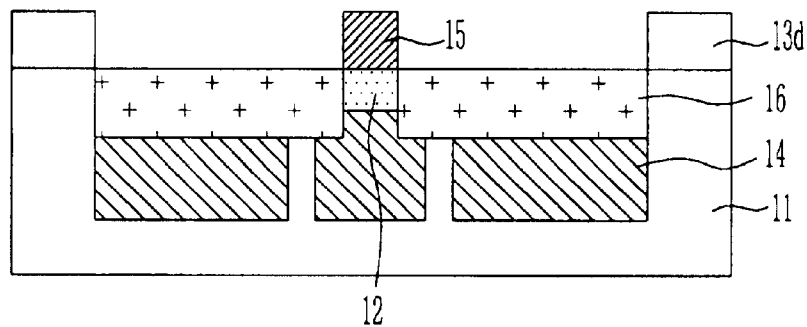

FIG. 1d illustrate a process of forming a LDD (Lightly Doped Drain) region for reducing the resistance between source-gate and gate-drain. A LDD layer 16 is formed at the side of a source/drain region 17 using both the gate formed through the above process and photolithographic film pattern like 13d as an ion implantation mask. More particularly, the concentration of the ion implantation energy and the impurity is higher than the condition that the channel layer is formed.

Figure 1E:
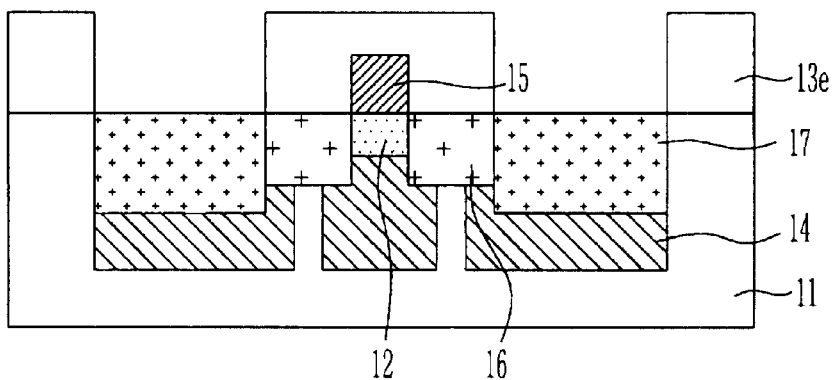

Referring now to FIG. 1e, silicon dopant ions of a high concentration are implanted using a photolithographic film pattern 13e to define a source/drain region 17 in the transistor.

Figure 1F:
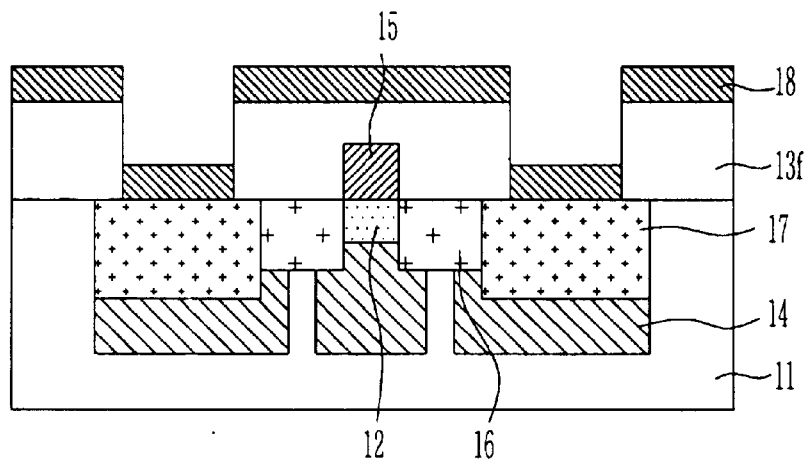
Figure 1G:
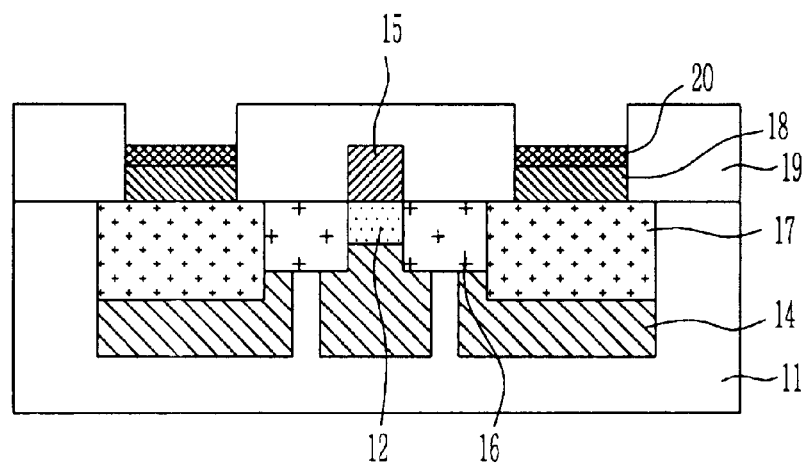
Figure 1H:
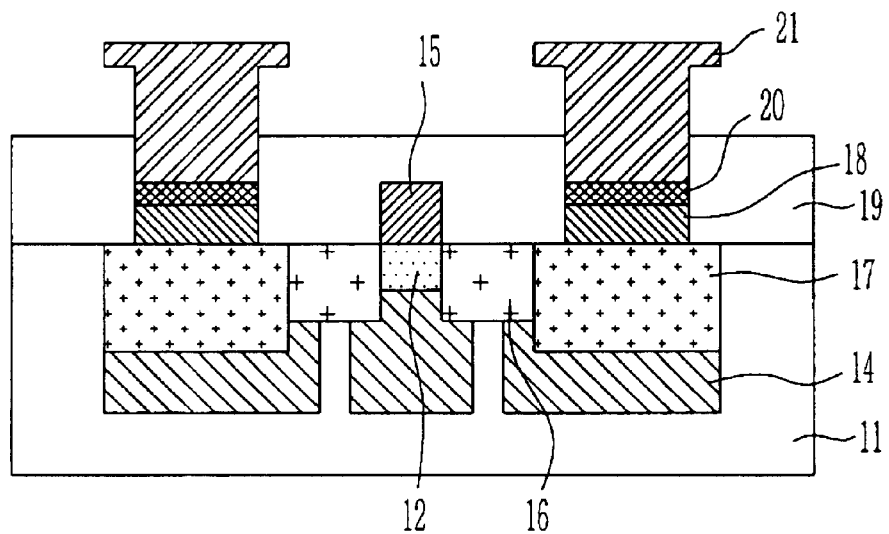

Thereafter, as shown in FIG. 1f, a metal for ohmic contact is deposited in the source/drain region 17. Then, a lift-off process, a cleaning process, an annealing process are sequentially performed to form an ohmic electrode 18, as shown in FIG. 1g. Next, silicon nitride ($SiN_x$) or silicon oxide ($SiO_x$) 19 and the like is deposited under a vacuum state using PECVD (Plasma Enhanced Chemical Vapor Deposition) method. Finally, a base metal 20 for improving an adhesive strength between metals is deposited for a bonding pad or metal for an air bridge. Next, a source and drain electrode 21 is formed by means of an electro-plating method, thus completing a self aligned gate transistor having a very small resistance in the source-gate and the gate-drain and a good pinch-off characteristic without a short channel effect, as shown in FIG. 1h.

As mentioned above, in the self aligned gate transistor of a channel structure according to the present invention, a refractory metal having a good high temperature stability is used and P-type impurity ions are implanted into a channel portion below the gate by a little wider than the length of the gate and into a source and drain pad portion. Therefore, the present invention can form a transistor having a good pinch-off characteristic with a small short channel effect and having a very low resistance between the source-gate and the gate-drain. As a result, the transistor has a good DC characteristic such as a breakdown voltage, a small parasitic resistance, good high temperature stability in a Schottky barrier and a good AC characteristic due to a small parasitic capacitance in a P-N junction below a channel.

Further, a high frequency characteristic can be improved due to reduced parasitic resistance and a refractory metal gate process can be applied to manufacture analog and digital transistor or MMIC (Monolithic Microwave Integrated Circuit).

Figure 2:
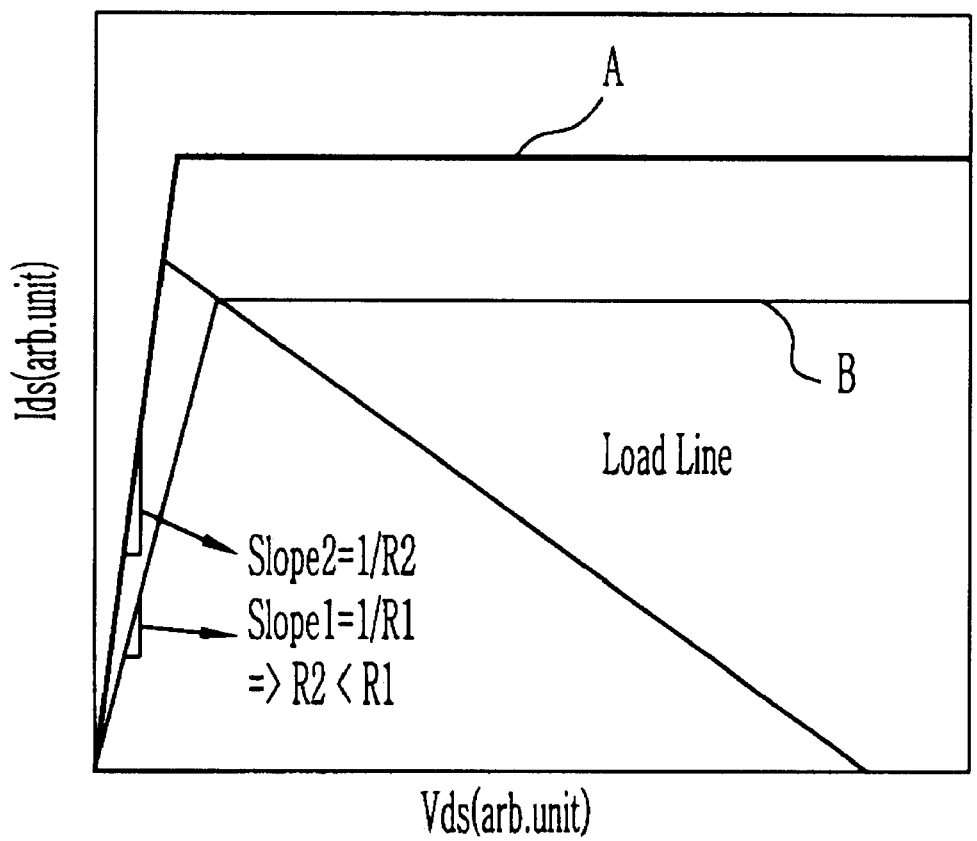
FIG. 2 is a current-voltage characteristic curve for explaining an increase in the current density, the power efficiency and the power density depending on an improved direct current (DC) characteristic of a self aligned gate transistor according to a preferred embodiment of the present invention.

FIG. 2 is a current-voltage characteristic curve for explaining an increase in the current density, the power efficiency and the power density depending on an improved direct current (DC) characteristic of a self-aligned gate transistor according to a preferred embodiment of the present invention. In FIG. 2, line "A" is a current-voltage characteristic curve of a self-aligned gate transistor according to a preferred embodiment of the present invention and line "B" is a current-voltage characteristic curve of a transistor according to the prior art. Referring to FIG. 2, a drain current of a self-aligned gate transistor according to a preferred embodiment of the present invention has been increased compared to a drain current of a transistor according to the prior art depending on reduction (R2<R1) in the resistance of the source-gate and the gate-drain.

As mentioned above, according to the present invention, a low resistance characteristic between source and gate and between gate and drain is employed at maximum and P-type impurity ions are implanted below a gate of a channel layer in order to manufacture a self aligned gate transistor. Thus, the present invention has outstanding advantages that it can improve a pinch-off characteristic without a short channel effect and can improve a drain breakdown characteristic. Further, according to the present invention, a transistor of a channel structure having a small parasitic capacitance in the channel can be manufactured. Therefore, the present invention has an advantage that it can be usefully used to manufacture a high frequency device having a good DC and RF characteristic.

The present invention has been described with reference to a particular embodiment in connection with a particular application. Those having ordinary skill in the art and access to the teachings of the present invention will recognize additional modifications and applications within the scope thereof.

It is therefore intended by the appended claims to cover any and all such applications, modifications, and embodiments within the scope of the present invention.

What is claimed is:

1. A method of manufacturing a self-aligned gate transistor with p-type impurities selectively implanted below the gate, source and drain electrodes comprising the steps of:

forming a channel layer in a semiconductor substrate;

defining a channel region, a first region and a second region in said semiconductor substrate, with said channel region being spaced from said first and second regions;

implanting p-type impurity into said channel region, said first and second regions;

forming a gate electrode on said channel layer over said channel region, wherein a width of said gate electrode is smaller than a width of said channel region;

performing a LDD ion implantation process;

performing an ion impurity process for source and drain regions;

forming an ohmic electrode on said source and drain regions;

forming a base metal on said ohmic electrode; and forming source and drain electrodes on said base metal.

2. The method as claimed in claim 1, wherein said p-type impurity is beryllium (Be), magnesium (Mg) or carbon (C).

3. The method as claimed in claim 1, wherein said gate electrode is made of a refractory metal.

4. The method as claimed in claim 3, wherein said refractory metal is a single layer made of tungsten (W), tungsten nitride (WNx), tungsten siliside (WSix) or tungsten silynitride (WSiNx), or a dual layer made of tungsten nitride/tungsten (WNx/W).

* * * * *